(12) United States Patent
Duer et al.

(10) Patent No.: US 8,092,138 B2
(45) Date of Patent: Jan. 10, 2012

(54) LARGE AREA SUBSTRATE PROCESSING SYSTEM WITH BETWEEN CHAMBER PLATFORM

(75) Inventors: Thomas L. Duer, Salinas, NJ (US); John A. Miller, Brentwood, CA (US)

(73) Assignee: Applied Materials, Inc., Santa Clara, CA (US)

( * ) Notice: Subject to any disclaimer, the term of this patent is extended or adjusted under 35 U.S.C. 154(b) by 224 days.

(21) Appl. No.: 12/643,034

(22) Filed: Dec. 21, 2009

(65) Prior Publication Data
US 2010/0158642 A1 Jun. 24, 2010

Related U.S. Application Data

(60) Provisional application No. 61/140,772, filed on Dec. 24, 2008.

(51) Int. Cl.
*H01L 21/677* (2006.01)
(52) U.S. Cl. ...................................................... 414/217
(58) Field of Classification Search .................. 414/217, 414/939, 266, 268, 287, 288, 935; 52/127.7, 52/378, 578, 633, 653.1, 654.1, 655.1; 182/130; 211/90.01, 90.04, 206
See application file for complete search history.

(56) References Cited

U.S. PATENT DOCUMENTS

| | | | | |
|---|---|---|---|---|
| 865,268 | A * | 9/1907 | Smith | 211/27 |
| 7,287,920 | B2 * | 10/2007 | Hayashi et al. | 396/611 |
| 2007/0125638 | A1 * | 6/2007 | Zhang et al. | 204/192.15 |

* cited by examiner

*Primary Examiner* — Saul Rodriguez
*Assistant Examiner* — Glenn Myers
(74) *Attorney, Agent, or Firm* — Patterson & Sheridan, L.L.P.

(57) ABSTRACT

Embodiments of the invention generally relate to a vacuum processing system for processing large area substrates, such as flat panel displays (i.e., LCD, OLED, and other types of flat panel displays), solar panels, and the like. In one embodiment, a vacuum processing system includes a plurality of processing chambers coupled to a vacuum transfer chamber suitable to accommodate a large area substrate and a least one horizontal platform disposed between adjacent processing chambers. The vacuum transfer chamber has a robot disposed therein. The platform is coupled to a base supporting one of the adjacent processing chambers.

6 Claims, 9 Drawing Sheets

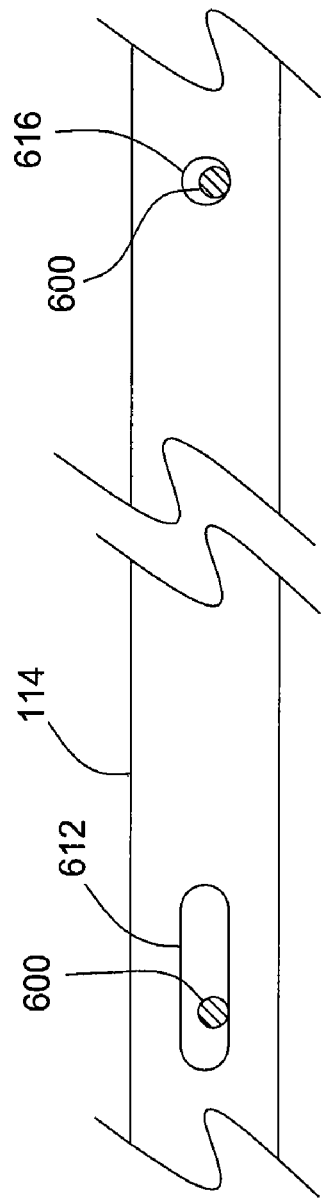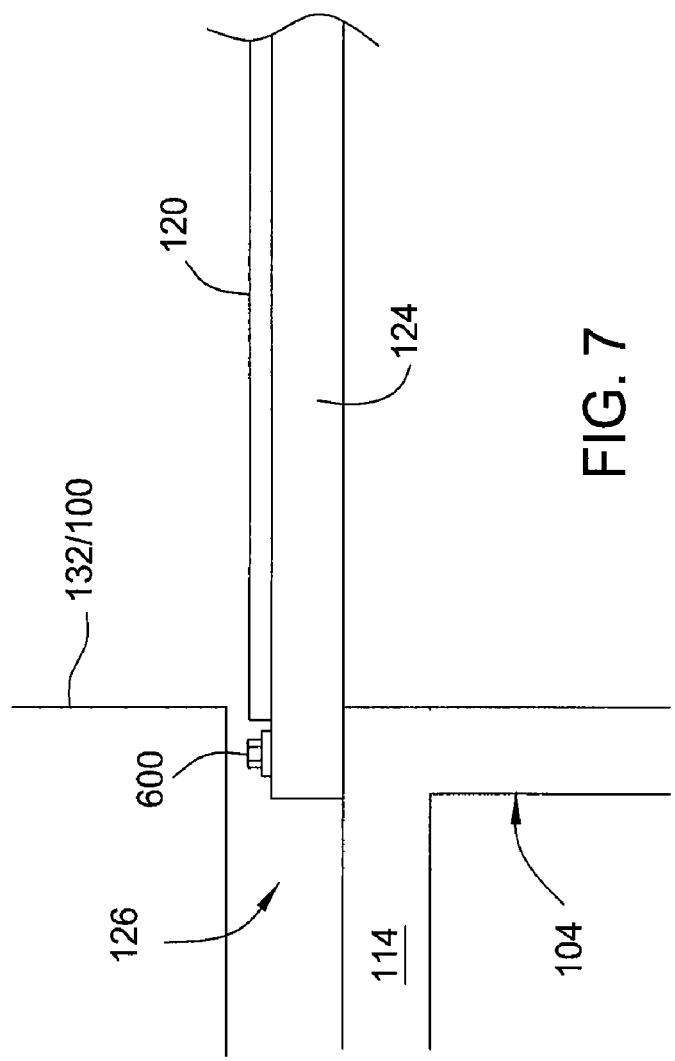

LARGE AREA SUBSTRATE PROCESSING SYSTEM WITH BETWEEN CHAMBER PLATFORM

CROSS REFERENCE TO RELATED APPLICATIONS

This application claims benefit of U.S. Provisional Patent Application Ser. No. 61/140,770, filed Dec. 24, 2008, which is incorporated by reference in its entirety.

BACKGROUND OF THE INVENTION

1. Field of the Invention

Embodiments of the invention generally relate to a vacuum processing system for processing large area substrates, such as flat panel displays (i.e., LCD, OLED, and other types of flat panel displays), solar panels, and the like.

2. Description of the Related Art

Large area substrates are utilized to produce flat panel displays (i.e., LCD, OLED, and other types of flat panel displays), solar panels, and the like. Large area substrates are generally processed in one or more vacuum processing chambers, where various deposition, etching, plasma processing and other circuit and/or device fabrication processes are performed. The vacuum processing chambers are typically coupled by a common vacuum transfer chamber that contains a robot that transfers the substrates between the different vacuum processing chambers. A load lock chamber is also coupled to the transfer chamber to facilitate entry and egress of processed and unprocessed substrates from the transfer chamber. The assembly of the processing, transfer and load lock chambers is often referred to as a processing system.

As processing systems increase in size, the size of the various utilities, such as power sources, controller, pumps, gas panels and the like, utilized to run the processing chambers has also increased, making the area around the processing system crowded and difficult to access. The limited access and crowded area creates a hazard to technicians working on and servicing the system.

Thus, there is a need for an improved system for processing large area substrates.

SUMMARY OF THE INVENTION

Embodiments of the invention generally relate to a vacuum processing system for processing large area substrates, such as flat panel displays (i.e., LCD, OLED, and other types of flat panel displays), solar panels, and the like. In one embodiment, a vacuum processing system includes a plurality of vacuum processing chambers coupled to a vacuum transfer chamber suitable to accommodate a large area substrate and a least one horizontal platform disposed between adjacent processing chambers. The vacuum transfer chamber has a robot disposed therein. The platform is coupled to a base supporting one of the adjacent processing chambers.

In another embodiment, a vacuum processing system includes a plurality of vacuum processing chambers coupled to a vacuum transfer chamber suitable to accommodate a large area substrate and a least one horizontal platform disposed between adjacent processing chambers. The vacuum transfer chamber has a robot disposed therein. The platform is coupled to a base supporting one of the adjacent processing chambers in a manner that permits the base to move relative to the platform.

In yet another embodiment, the platform is coupled to bases supporting adjacent processing chambers in a manner that permits each base to move in a different direction relative to the platform. The different directions may have a common center to a radial orientation. Alternatively, each direction may be perpendicular to a respective facet of a transfer chamber to which each processing chamber is coupled thereto.

In still another embodiment, a safety rail coupled along an outer edge of each platform.

BRIEF DESCRIPTION OF THE DRAWINGS

So that the manner in which the above recited features of the invention are attained and can be understood in detail, a more particular description of the invention, briefly summarized above, may be had by reference to the embodiments thereof which are illustrated in the appended drawings. It is to be noted, however, that the appended drawings illustrate only typical embodiments of this invention and are therefore not to be considered limiting of its scope, for the invention may admit to other equally effective embodiments.

FIG. 7 is a sectional view of one embodiment of the platform support disposed on a frame supporting a processing chamber;

FIG. 8 is a partial top of processing chamber support frame;

To facilitate understanding, identical reference numerals have been used, wherever possible, to designate identical elements that are common to the figures. It is contemplated that features of one embodiment may be beneficially incorporated in other embodiments without further recitation.

It is to be noted, however, that the appended drawings illustrate only exemplary embodiments of this invention and are therefore not to be considered limiting of its scope, for the invention may admit to other equally effective embodiments.

DETAILED DESCRIPTION

The invention generally provides a high volume/high throughput load lock chamber having multiple stacked substrate transfer chambers. The invention is illustratively described below utilized in a flat panel processing system, such as those available from AKT, a division of Applied Materials, Inc., Santa Clara, Calif. However, it should be understood that the invention has utility in other system configurations, wherever high throughput substrate transfer through a load lock chamber of large area substrates is desired.

Figure 1:
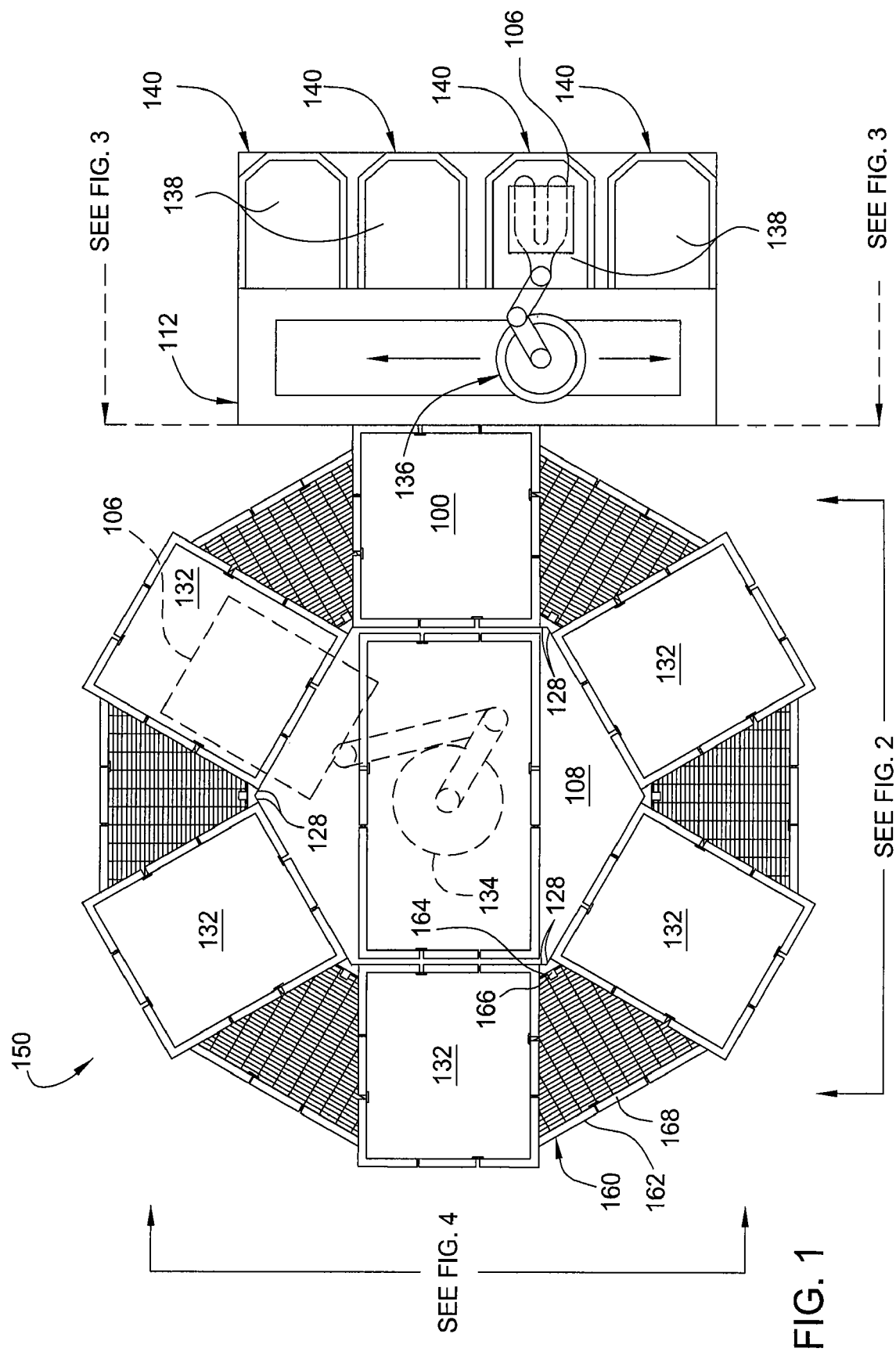
FIG. 1 is a top plan view of one embodiment of a processing system for processing large area substrates.

FIG. 1 is a top plan view of one embodiment of a processing system 150 suitable for processing large area substrates (e.g., substrates having a plan area greater than about 1 square meter, including substrates having a plan area greater than about 3 square meters). The processing system 150 typically includes a transfer chamber 108 coupled to a factory interface 112 by a load lock chamber 100. In one embodiment, the load lock chamber 100 has a plurality of single substrate transfer chambers.

The transfer chamber 108 has at least one vacuum robot 134 (shown in phantom) disposed therein that is adapted to transfer substrates between a plurality of circumscribing processing chambers 132 and the load lock chamber 100. The vacuum robot 134 is located in the center of the transfer chamber 108. The transfer chamber 108 has a plurality of facets 128. Each facet 128 provides a mounting surface for a respective one of the chambers 100, 132. In one embodiment, the facets 128 have an orientation perpendicular to a radius extending through the center of the facet 128 from the center of the transfer chamber 108.

One or more of the processing chambers 132 may be a pre-heat chamber that thermally conditions substrates prior to processing, a post-heat chamber that thermally conditions substrates after one or more processing steps, a physical vapor deposition chamber, a chemical vapor deposition chamber, a plasma treatment chamber, or other vacuum chamber suitable for large area substrate processing. Typically, the transfer chamber 108 is maintained at a vacuum condition to eliminate the necessity of adjusting the pressures between the transfer chamber 108 and the individual processing chambers 132 after each substrate transfer.

The factory interface 112 is shown in FIG. 1 with the top removed to reveal a plurality of substrate storage cassettes 138 and a dual blade atmospheric robot 136. The cassettes 138 are generally removably disposed in a plurality of bays 140 formed on one side of the factory interface 112. The atmospheric robot 136 is adapted to transfer substrates 106 between the cassettes 138 and the load lock chamber 100. Typically, the factory interface 112 is maintained at or slightly above atmospheric pressure.

Figure 2:
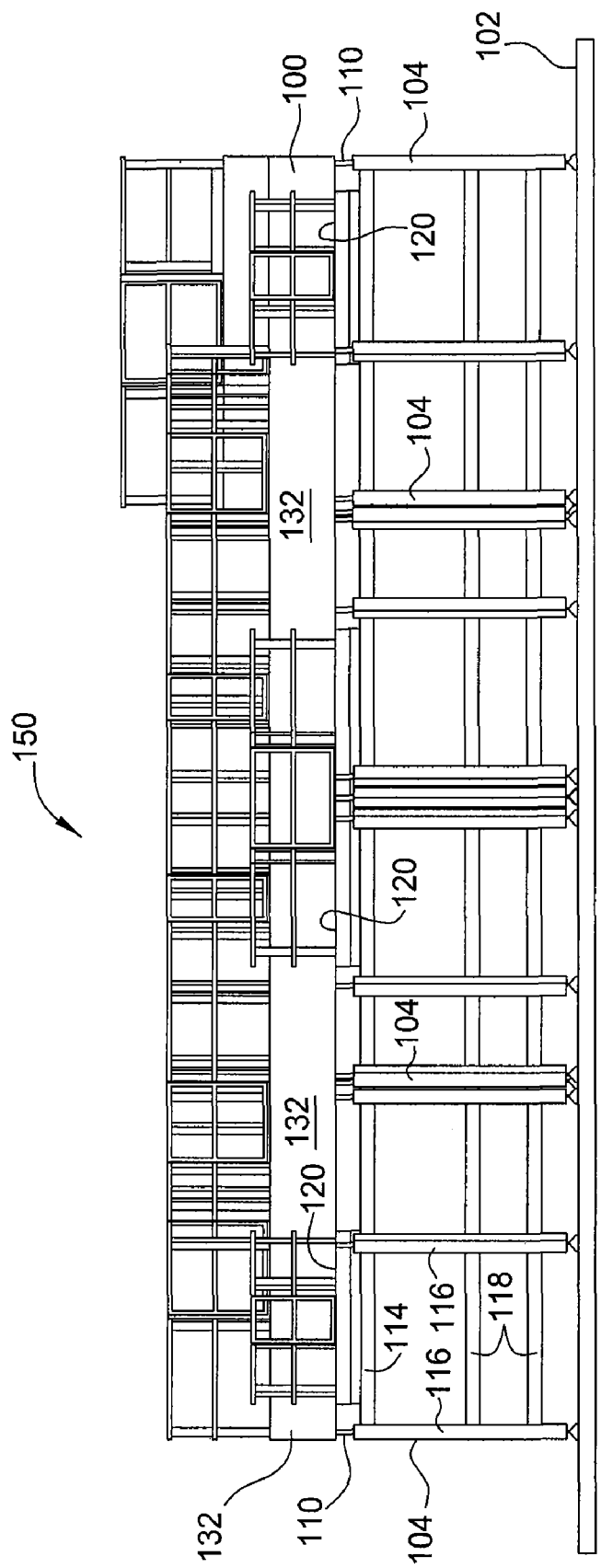
FIGS. 2-4 are side views of the processing system of FIG. 1.
Figure 3:
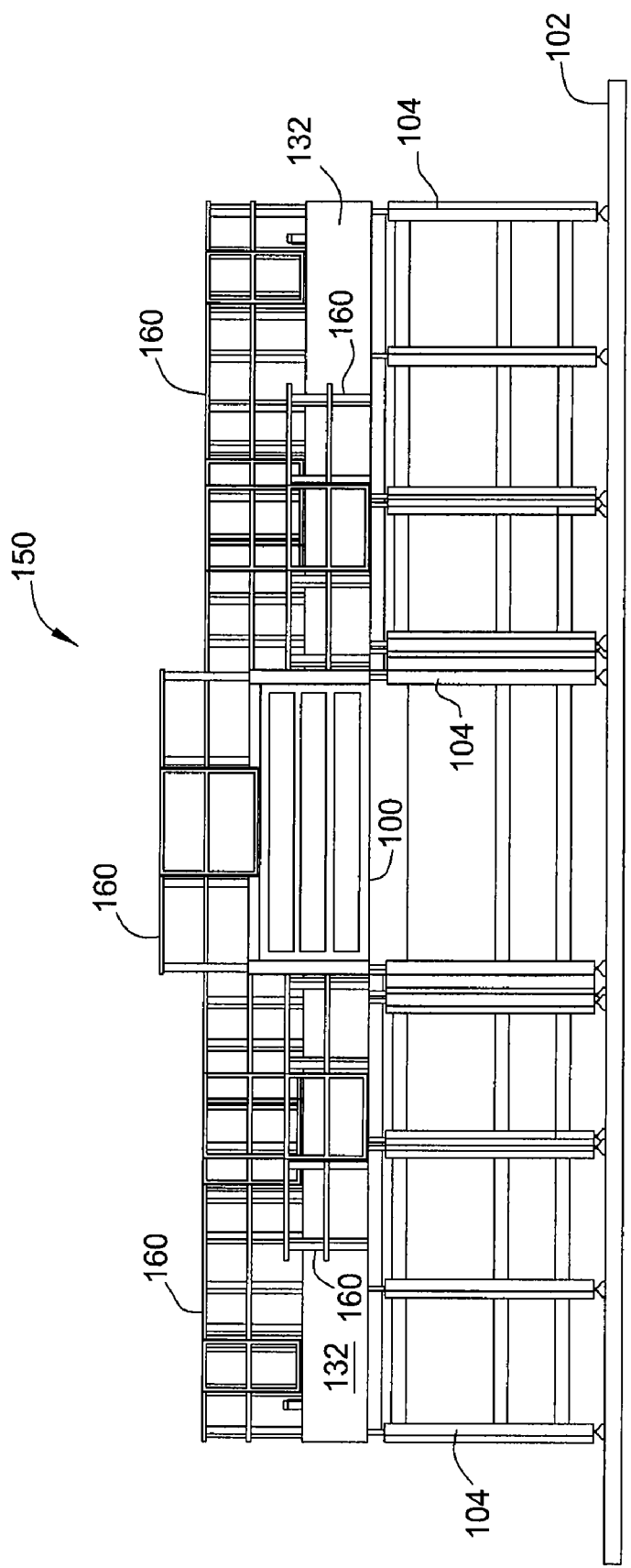
Figure 4:
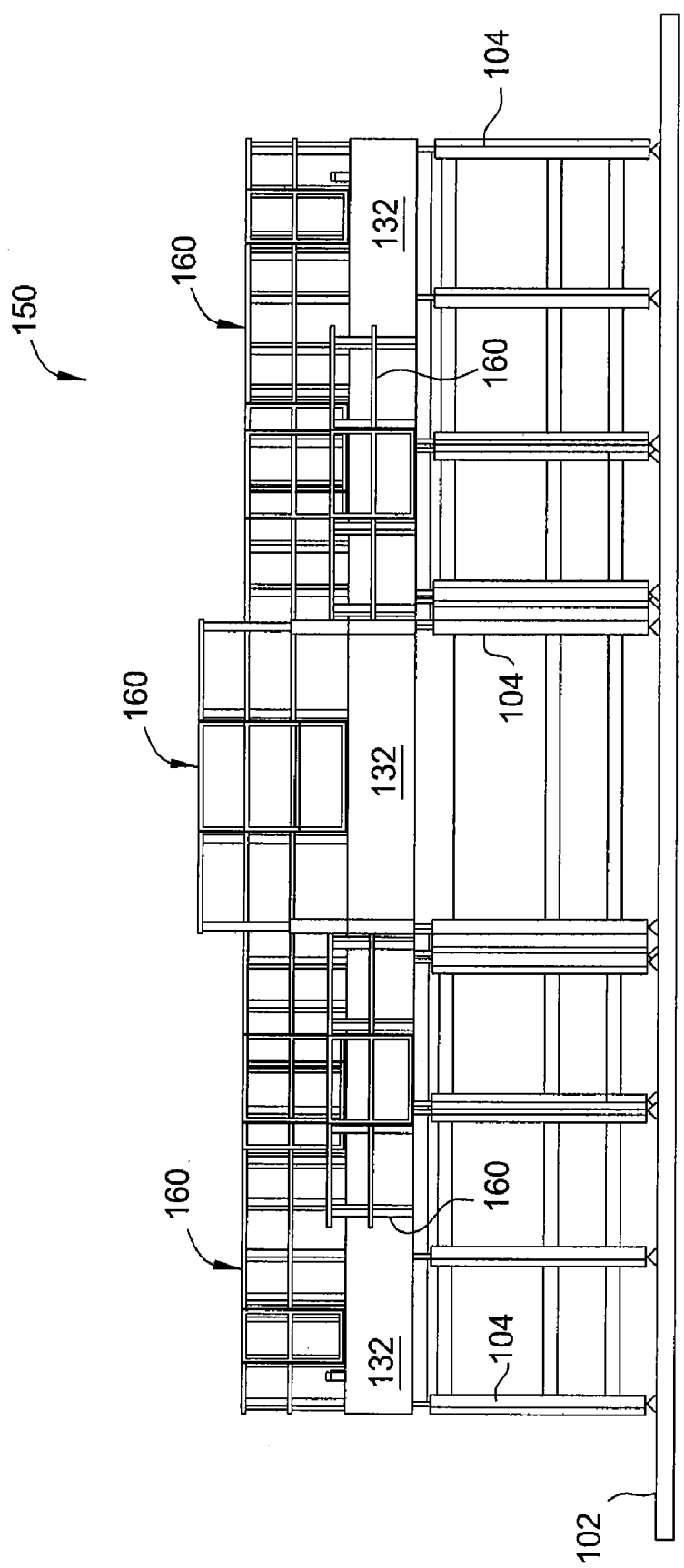
Figure 5:
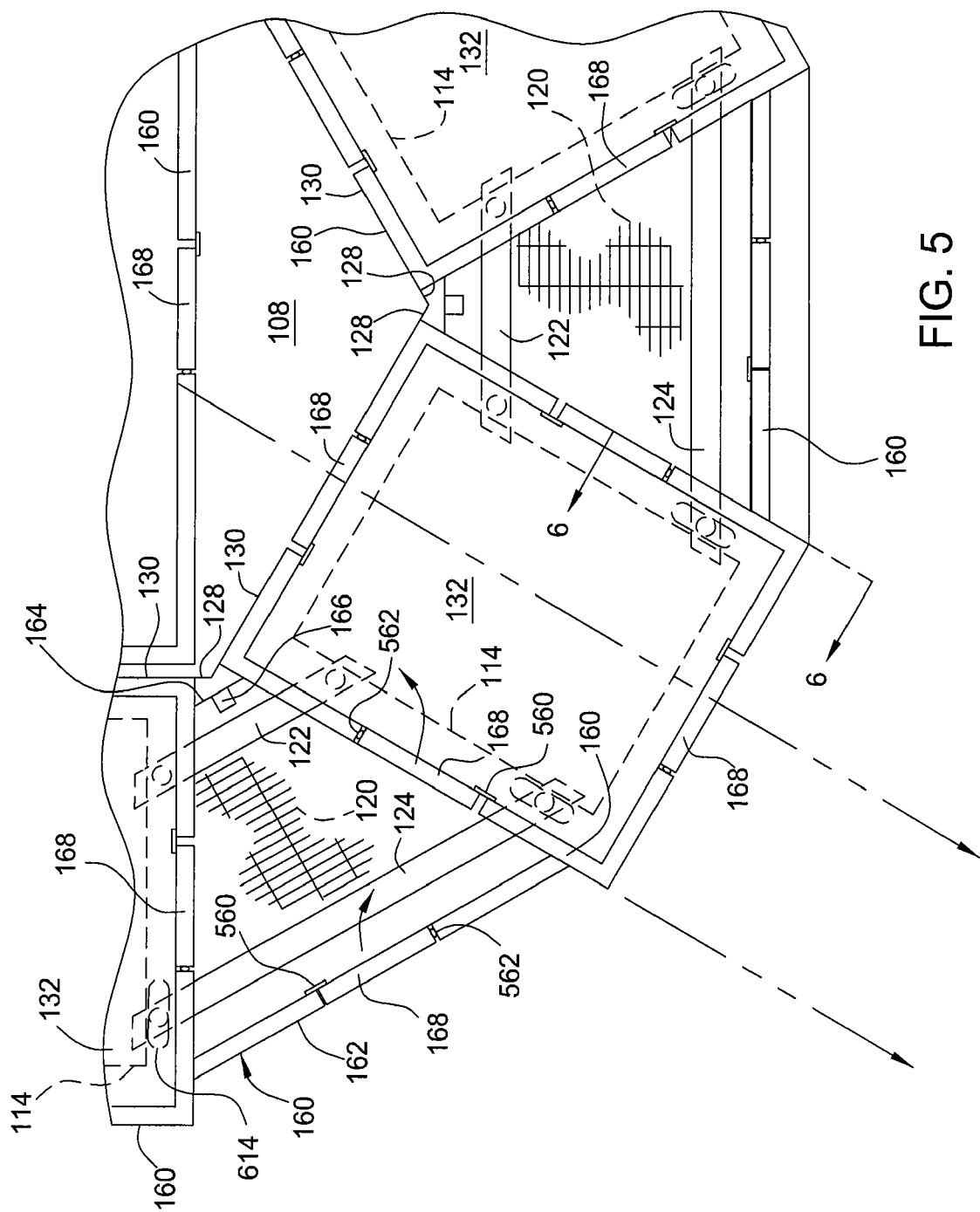
FIG. 5 is a partial top view of the processing system of FIG. 1 illustrating one embodiment of a platform disposed between adjacent chambers.

Referring additionally to the side views of the processing system 150 depicted in FIGS. 2-4 and the top partial view of FIG. 5, each of the processing chambers 132 is supported above a floor 102 of the facility by a machine base 104. The machine base 104 may be fabricated from tubular steel, aluminum or other sturdy structural material suitable for supporting the weight of the chambers of the processing system 150. In one embodiment, the machine base 104 includes an upper tubular frame 114 supported by legs 116. The machine base 104 may also include a plurality of cross-members 118 interconnecting the legs 116. The space below and interstitial to the machine base 104 is utilized for the system utilities, such as such as power sources, controller, pumps, gas panels and the like.

The upper tubular frame 114 is generally parallel to the floor 102 of the facility, and includes a back member connected at each end by side members to a front member. The back member is generally parallel and adjacent to one of the facets 128. The front member is substantially parallel to the back member and adjacent to the outer edge of the chamber (132 or 100) supported on the frame 114. The side members of the tubular frame 114 are parallel to each other and have an orientation generally perpendicular to the back member.

The processing chambers 132 are secured to the machine base 104 by an adjustment bracket or screw 110 which may be utilized to level the processing chamber 132 on the tubular frame 114 of the machine base 104. The adjustment screw 110 maintains the processing chamber 132 and the tubular frame 114 of the machine base 104 in a spaced-apart relation, defining an interstitial space 126 therebetween (see, additionally FIGS. 6-7).

The tubular frame 114 of the machine base 104 generally expands and contracts with the expansion and contraction of the processing chamber 132 supported thereon. The tubular frame 114 of the machine base 104 supporting the load lock chamber 100 generally moves with the movement of the load lock chamber 100 as it undergoes thermal and pressure cycles.

A plurality of platforms 120 are coupled between adjacent chambers 100, 132. The platforms 120 are elevated from the floor 102 to provide extra space around the processing system, leaving ample space below the platforms for system utilities. In one embodiment, the platforms 120 are elevated at least 1.83 m (72 inches) above the floor 102. In another embodiment, the platforms 120 are elevated at least 2.08 m (82 inches) above the floor 102. Other elevations may be selected to meet the space requirements of a particular processing system design.

The attachment of the platforms 120 to the processing chambers 132 is made in a manner that allows the processing chambers to move relative to the platforms. For example, as one processing chamber 132 thermally expands at a different rate or amount relative to an adjacent processing chamber, the manner of coupling prevents the platform 120 from pulling, pushing or otherwise exerting a force on the processing chamber which could create robot placement problems if the center of the processing chamber was unexpectedly moved relative to the center of the transfer chamber.

The platforms 120 are coupled to the side members of the tubular frame 114 of the machine base 104 that supports the chambers by at least two support members. In one embodiment, an inner support member 122 and an outer support member 124 are shown coupled to the side members of the tubular frame 114. Each support member 122, 124 extends into the interstitial space 126 so that the ends of the support members 122, 124 are supported by the tubular frame 114.

The inner support member 122 is generally secured to the tubular frame 114 in a manner that substantially fixes the inner support member 122 relative to the frame 114. The outer support member 124 is slidably coupled to the tubular frame 114. In one embodiment, the coupling between the outer support member 124 and the tubular frame 114 allows the tubular frame 114 to move in a substantially radial direction (shown by arrow 502 in FIG. 5) relative to a center of the transfer chamber 108. In another embodiment, the coupling between the outer support member 124 and the tubular frame 114 allows the tubular frame 114 to move in a direction substantially perpendicular (shown by arrow 504 in FIG. 5) to the facet 128 of the transfer chamber 108 that is mated with an inner side 130 of the chamber 100, 132. Accordingly, as the processing chamber 132 thermally expands and contracts with the tubular frame 114 expanding and contracting therewith, the platform 120 does not pull, push or otherwise inhibit the movement of the processing chamber 132 so that the center of the processing chamber 132 is not displaced unexpectedly in a manner that could create substrate misplacement by the vacuum robot 134 (which would occur if the center of the processing chamber was not in an expected position) or unduly fatigue fasteners or other components of the system. Additionally, as the load lock chamber 100 expands and contracts due to thermal and/or pressure cycling with the tubular frame 114 expanding and contracting therewith, the platform 120 does not pull, push or otherwise inhibit the movement of the load lock chamber 100 so that the center of the load lock chamber 100 is not displaced unexpectedly in a manner that could create substrate misplacement by the vacuum robot 134 or the atmospheric robot 136, or unduly fatigue fasteners or other components of the system.

Figure 6:
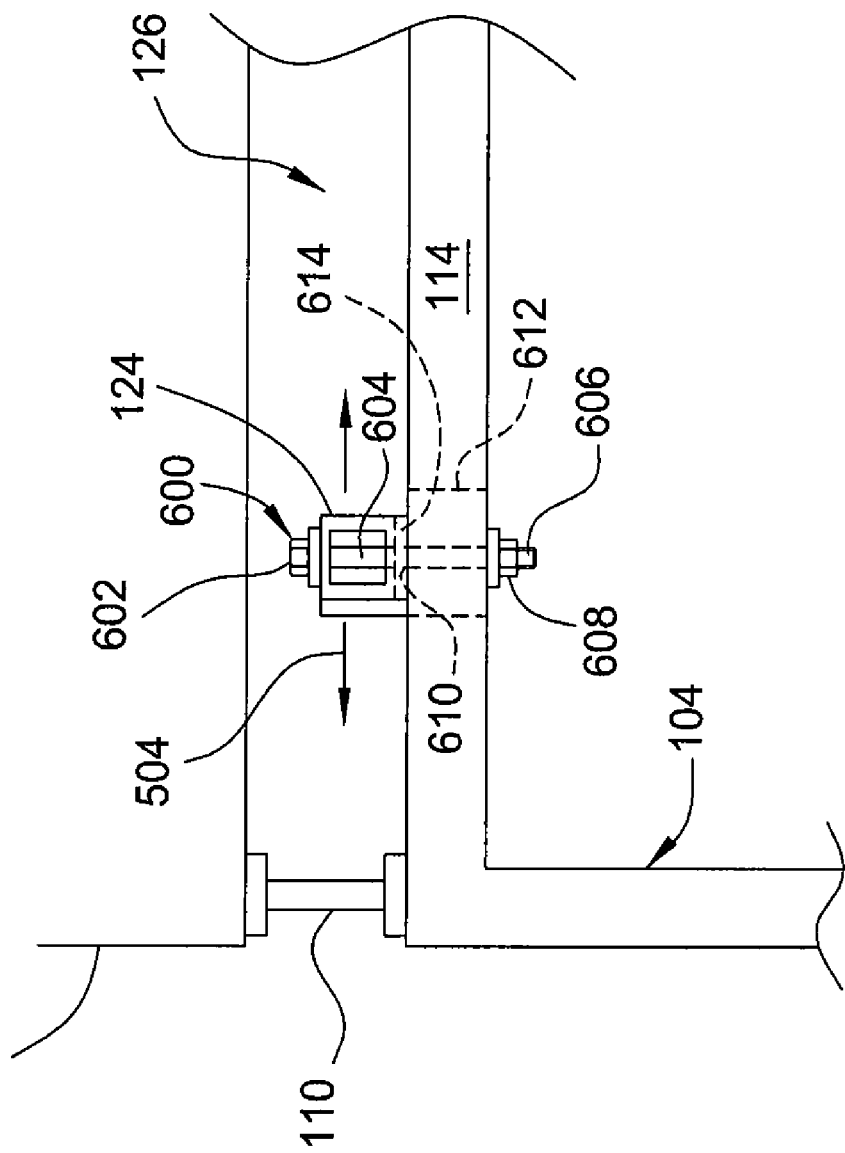
FIG. 6 is a partial side view of one embodiment of the platform and platform support.

Referring now to FIGS. 6-8, the outer support member 124 is coupled to the tubular frame 114 by a fastener 600. The fastener 600 may be a bolt, pin or other suitable object for slidably securing the outer support member 124 to the tubular frame 114. In the embodiment depicted in FIG. 6, the fastener 600 is a shoulder bolt having a head 602, a shaft 604 and a threaded portion 606. The head 602 keeps the fastener 600 from passing through a hole 610 formed through the tubular frame 114. The shaft 604 is disposed through the hole 610 in the outer support member 124 and a slot 612 formed through the tubular frame 114. Equivalently, the hole 610 may be formed in the tubular frame 114 and the slot 612 may be formed through the outer support member 124. The shaft 604 of the fastener 600 provides a smooth bearing surface. A nut 608 engages the threaded portion 606 to prevent the fastener 600 from disengaging the tubular frame 114 and support member 124.

The slot 612 is elongated in one of the directions 502, 504 to accommodate the relative motion between the frame 114 and platform 120. In the embodiment depicted in FIG. 8, the slot 612 is elongated in the direction 504, which is also aligned with the orientation of the transverse member of the tubular frame 114 to which the outer support member 124 is coupled. In one embodiment, the length of the elongation of the slot 612 accommodates a motion of greater than about 2.54 cm (1 inch), for example greater than about 3.81 cm (1.5 inches) such as greater than 5.08 cm (2 inches).

Optionally, a friction reducing pad 614 (shown in phantom in FIG. 5) may be disposed between the tubular frame 114 and the outer support member 124. The friction reducing pad 614 allows the tubular frame 114 to slide more readily relative to the outer support member 124. In one embodiment, the friction reducing pad 614 is a high density polymer, such as high-density polyethylene or ultra high molecular weight polyethylene, or a friction reducing coating.

The inner support member 122 is similarly coupled to the tubular frame 114 by another fastener 600 extending through a hole 616 formed through the frame 114. Optionally, the slot 612 and the hole 616 may be slightly oversized to accommodate movement of the frame 114 at a small angle relative to the directions 502, 504.

Referring now to FIG. 7, the fastener 600 is located in the interstitial space 126 below the processing chamber 132 (or load lock chamber 100) and above the frame 114. In this location, the fastener 600 is tucked under the processing chamber 132 and beyond of the edge of the working surface of the platform 120, and as such, is not a trip point, improving the safety of the platform 120 without undue expense for more elaborate shielding design alternatives. In one embodiment, the height of the interstitial space 126 is selected to allow the fastener 600 to be removed from the frame 114 so that the support members 122, 124 can be removed without decoupling the processing chamber 132. In another embodiment, the fastener 600 may extend up through the tubular frame 114 to mate with the nut 608 on the upper side of the frame 114.

The platform 120 may be a solid planar surface, an expanded metal surface, a grate or other surface suitable for a technician to stand upon. The platform 120 is elevated above the floor 102 of the facility to allow system utilities which do not fit below the machine base 104 to be positioned below the platforms 120 adjacent the processing chambers 132 while simultaneously allowing for technicians to access the various chambers of the processing system 150.

A safety rail 160 is provided on an outer edge 162 of the platform 120 to prevent technicians from falling. A second safety rail or post 166 is provided on an inner edge 164 of the platform to prevent technicians from squeezing between the chambers and onto the transfer chamber 108. The safety rail 160 along the outer edge 162 of the platform 120 includes a gate 168.

Referring back to FIG. 5, the gate 168 has a stop 560 that prevents the gate 168 from opening in a direction away from the transfer chamber 108. The stop 560 prevents the gate 168 from opening if a technician inadvertently leans against the gate 168. The gate 168 also includes a spring loaded hinge 562 that biases the gate 168 to a closed position. The gate 168 may also include a latch (not shown) to secure the gate 168 in a closed position. In one embodiment, a technician may access platform 120 by positioning mobile steps (not shown) in front of the gate 168 along the outer edge 162 of the platform 120.

Figure 9:
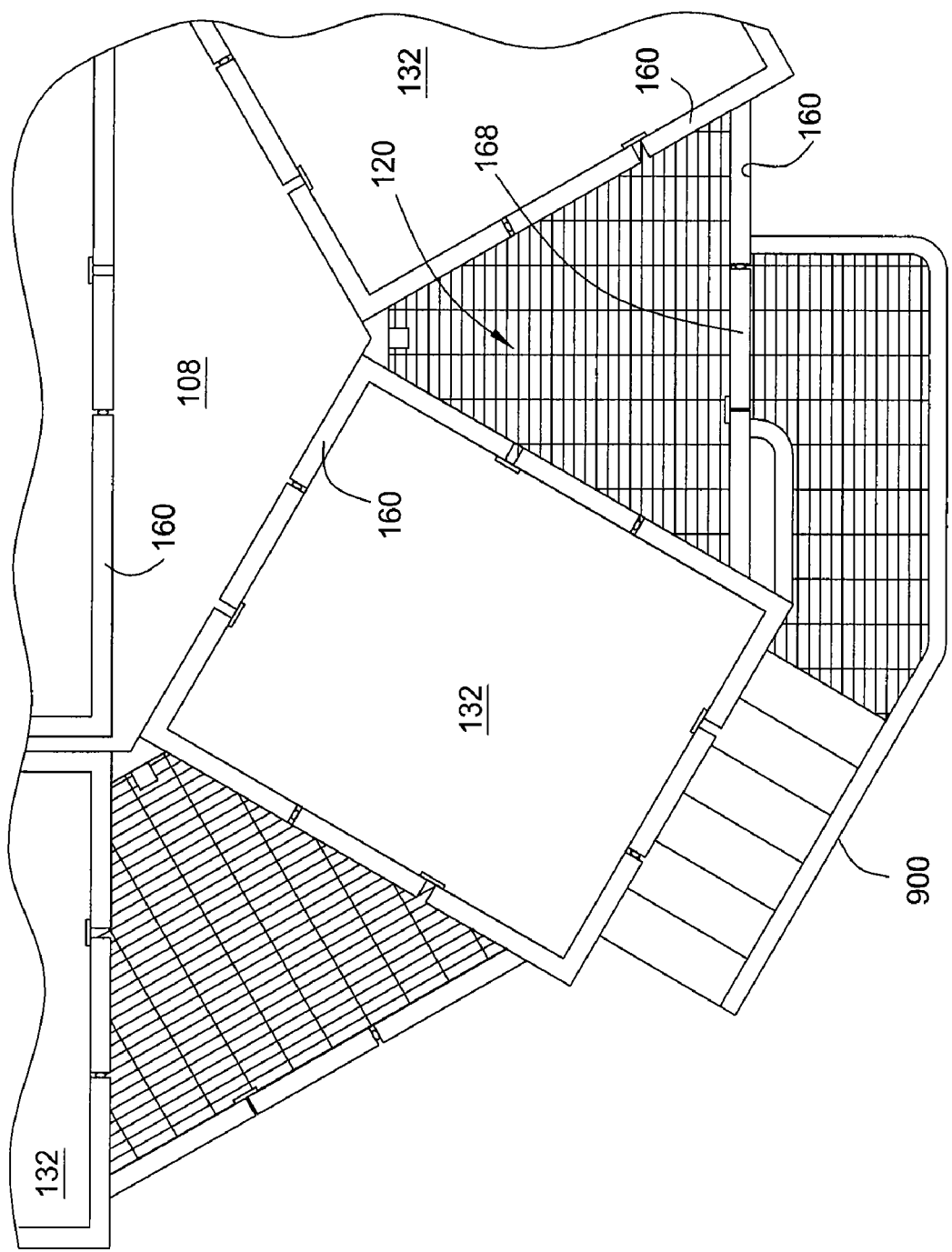
FIG. 9 is a partial top view of a processing system illustrating another embodiment of a platform disposed between adjacent chambers.

Alternatively as shown in FIG. 9, permanent steps 900 may be provided. The permanent steps 900 may be a vertical ladder extending from the outer edge 162 of the platform 120. The permanent steps 900 may alternatively be inclined and dog-leg from the gate 168 at the outer edge 162 of the platform 120 around the outside edge of the processing chamber 132.

Figure 10:
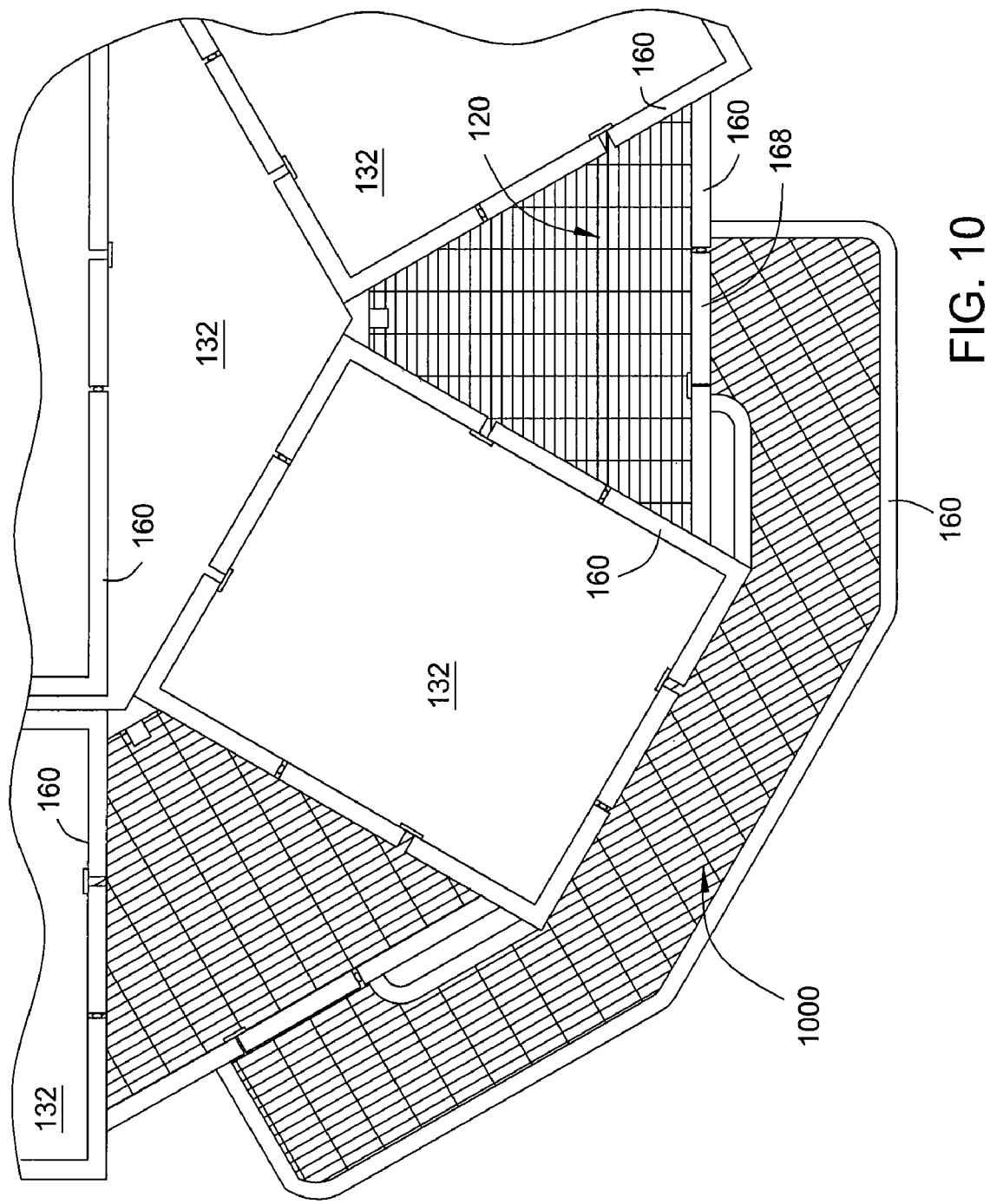
FIG. 10 is a partial top view of a processing system illustrating another embodiment of a platform disposed between adjacent chambers.

Alternatively as shown in FIG. 10, a cat-walk 1000 may be provided that joins two or more of the platforms 120. In the embodiment of FIG. 10, the cat-walk 1000 wraps around the outside edge of the processing chamber 132.

As also shown in FIGS. 1-5, safety rails 160 having inwardly opening gates 168 are positioned on all of the chambers 100, 108, 132 of the processing system 150.

Thus, a processing system is provided that facilitates both access to the various chambers of the system while leaving room for utilizes to be positioned below and adjacent the processing chamber. Railings are strategically provided on the platform and other portions of the processing system to allow technicians safe access to the processing system.

While the foregoing is directed to the preferred embodiment of the present invention, other and further embodiments of the invention may be devised without departing from the basic scope thereof. The scope of the invention is determined by the claims which follow.

What is claimed is:
1. A vacuum processing system, comprising:
    a vacuum transfer chamber having a robot disposed therein, the vacuum transfer chamber suitable to accommodate a large area substrate;
    a first processing chamber coupled to a first facet of the transfer chamber, the first processing chamber supported in a spaced-apart relation above a first machine base;
    a second processing chamber coupled to a second facet of the transfer chamber, the second processing chamber supported in a spaced-apart relation above a second machine base;
    a third processing chamber coupled to a third facet of the transfer chamber, the third processing chamber supported in a spaced-apart relation above a third machine base;
    a first horizontal platform;
    a first outer support member extending laterally beyond the first platform and into an interstitial space defined between the first base and the first processing chamber, the first outer support member slidably coupled to the first base supporting the first platform, the first outer support member extending laterally beyond the first platform and into an interstitial space defined between the second base and the second processing chamber, the first outer support member slidably coupled to the second base supporting the second processing chamber;

a first inner support member extending laterally beyond the first platform and into the interstitial space defined between the first base and the first processing chamber, the first inner support member being substantially fixed to the first base, the first inner support member supporting the first platform, the first inner support member extending laterally beyond the first platform and into the interstitial space defined between the second base and the second processing chamber, the first inner support member being substantially fixed to the second base;

a second horizontal platform;

a second outer support member extending laterally beyond the second platform and into an interstitial space defined between the second base and the second processing chamber, the second outer support member slidably coupled to the second base supporting the second processing chamber, the second outer support member supporting the second platform, the second outer support member extending laterally beyond the second platform and into an interstitial space defined between the third base and the third processing chamber, the outer support member slidably coupled to the third base supporting the third processing chamber; and a second inner support member extending laterally beyond the second platform and into the interstitial space defined between the second base and the second processing chamber, the second inner support member being substantially fixed to the second base, the second inner support member supporting the second platform, the second inner support member extending laterally beyond the second platform and into the interstitial space defined between the third base and the third processing chamber, the second inner support member being substantially fixed to the third base.

2. The vacuum processing system of claim 1 further comprising:

a first fastener coupling the first outer support member to a horizontal first frame of the first base, the first fastener extending through a first slot formed in one of the first outer support member or the first frame; and a second fastener coupling the first outer support member to a horizontal second frame of the second base, the second fastener extending through a second slot formed in one of the first outer support member or the second frame.

3. The vacuum processing system of claim 2, wherein the slots have a radial orientation relative to a center of the transfer chamber.

4. The vacuum processing system of claim 2, wherein the first slot has an orientation in a direction perpendicular to a first facet of the transfer chamber to which the first processing chamber supported by the first base is coupled; and wherein the second slot has an orientation in a direction perpendicular to a second facet of the transfer chamber to which the second processing chamber supported by the second base is coupled.

5. The vacuum processing system of claim 2 further comprising:

a safety rail coupled along an outer edge of each platform.

6. The vacuum processing system of claim 5, wherein each of the safety rails further comprises:

an inwardly opening gate.

* * * * *